(12) United States Patent
Ogliari et al.

(10) Patent No.: US 10,211,085 B2
(45) Date of Patent: Feb. 19, 2019

(54) TOOL FOR MANIPULATING SUBSTRATES, MANIPULATION METHOD AND EPITAXIAL REACTOR

(71) Applicant: LPE S.P.A., Baranzate (MI) (IT)

(72) Inventors: Vincenzo Ogliari, Baranzate (IT); Francesco Corea, Baranzate (IT); Franco Preti, Baranzate (IT)

(73) Assignee: LPE S.P.A., Baranzate (MI) (IT)

( * ) Notice: Subject to any disclaimer, the term of this patent is extended or adjusted under 35 U.S.C. 154(b) by 0 days.

(21) Appl. No.: 15/385,473

(22) Filed: Dec. 20, 2016

(65) Prior Publication Data

US 2017/0103912 A1    Apr. 13, 2017

Related U.S. Application Data

(63) Continuation of application No. PCT/IB2015/054975, filed on Jul. 2, 2015.

(30) Foreign Application Priority Data

Jul. 3, 2014   (IT) .............................. MI2014A1210
Apr. 20, 2015  (IT) .............................. CO2015A0008

(51) Int. Cl.
*H01L 21/683*    (2006.01)
*B25J 15/06*     (2006.01)
*C23C 16/458*    (2006.01)
*C30B 25/12*     (2006.01)

(52) U.S. Cl.
CPC ...... *H01L 21/6838* (2013.01); *B25J 15/0616* (2013.01); *C23C 16/4582* (2013.01); *C30B 25/12* (2013.01)

(58) Field of Classification Search
CPC .. H01L 21/6838; B25J 15/0616; C30B 25/12; C23C 16/4582
USPC ........................................................ 294/213
See application file for complete search history.

(56) References Cited

U.S. PATENT DOCUMENTS

| 6,537,011 | B1 | 3/2003 | Wang et al. |
| 7,293,811 | B2 * | 11/2007 | Bonora ............... H01L 21/6838 294/183 |
| 8,740,273 | B2 * | 6/2014 | He ........................ B25J 15/00 294/192 |

(Continued)

FOREIGN PATENT DOCUMENTS

| DE | 102010017082 A1 | 12/2011 |
| JP | 2003100848 A | 4/2003 |

(Continued)

*Primary Examiner* — Stephen A Vu
(74) *Attorney, Agent, or Firm* — King & Schickli, PLLC

(57) ABSTRACT

The tool (1) for manipulating substrates in an epitaxial reactor comprises an arm (2), a gripping disc (3) and a ball joint (4); said gripping disc (3) has a seat (5) on a lower face thereof for receiving a substrate (6) to be manipulated; said gripping disc (3) is mounted on the arm (2) through said ball joint (4) placed centrally with respect to said gripping disc (3); said gripping disc (3) is shaped so as to come into contact only with the upper edge of said substrate (6) to be manipulated; said gripping disc (3) has two degrees of freedom of rotational movement with respect to said arm (1) to allow adapting to the position of a substrate in a pocket of a susceptor of an epitaxial reactor.

17 Claims, 5 Drawing Sheets

(56) References Cited

U.S. PATENT DOCUMENTS

| | | | |
|---|---|---|---|
| 8,752,872 B2* | 6/2014 | Kent | H01L 21/68707 |
| | | | 294/106 |
| 8,764,085 B2* | 7/2014 | Urabe | H01L 21/68707 |
| | | | 294/103.1 |
| 9,355,882 B2* | 5/2016 | Wu | H01L 21/6838 |
| 9,381,577 B2* | 7/2016 | Iizuka | B23B 31/307 |
| 2003/0114016 A1 | 6/2003 | Tischler | |
| 2007/0295275 A1 | 12/2007 | Ogliari et al. | |
| 2008/0014057 A1 | 1/2008 | Juergensen et al. | |
| 2008/0190357 A1 | 8/2008 | Karlsson et al. | |
| 2010/0260589 A1 | 10/2010 | Hwang et al. | |
| 2013/0213300 A1 | 8/2013 | Sung | |

FOREIGN PATENT DOCUMENTS

| | | | |
|---|---|---|---|
| JP | 2012099755 A | 5/2012 |
| JP | 5846734 B2 | 1/2016 |
| KR | 0148714 B1 | 8/1998 |
| WO | 9851844 A1 | 11/1998 |
| WO | 0005751 A1 | 2/2000 |
| WO | 0048234 A1 | 8/2000 |
| WO | 2004053187 A1 | 6/2004 |
| WO | 2004053188 A1 | 6/2004 |
| WO | 2005121417 A1 | 12/2005 |
| WO | 2006024572 A1 | 3/2006 |
| WO | 2007088420 A2 | 8/2007 |

* cited by examiner

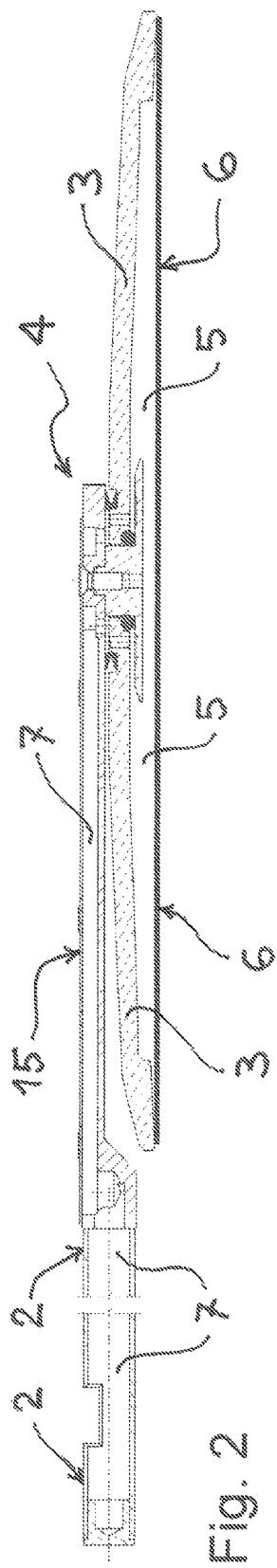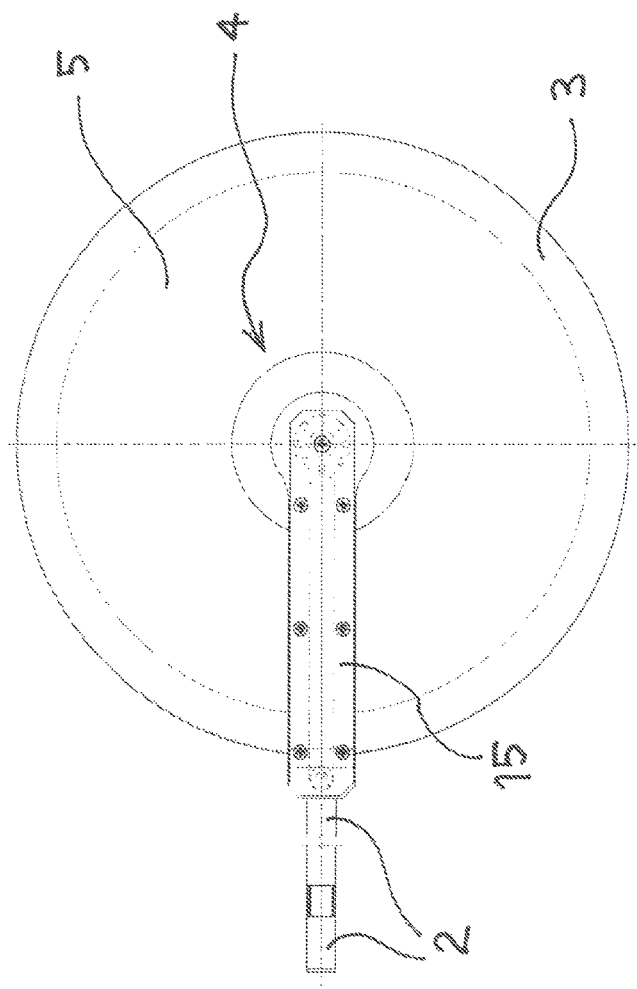

TOOL FOR MANIPULATING SUBSTRATES, MANIPULATION METHOD AND EPITAXIAL REACTOR

This application is a continuation of PCT/IB2015/054975, the disclosure of which is incorporated by reference, and which application qualifies as a U.S. patent application according to 35 USC 363 and contains a certified copy of Italian patent applications MI2014A001210 and CO2015A000008, the disclosures of which are incorporated by reference.

DESCRIPTION

Field of the Invention

This disclosure relates to a tool for manipulating substrates in an epitaxial reactor, a relative manipulation method and a relative epitaxial reactor.

The tool finds advantageous application in epitaxial reactors, comprising a susceptor with one or more pockets adapted to accommodate the substrates, in particular a rotary disc-shaped susceptor with horizontal pockets.

Background Art

There are various types of epitaxial reactors.

In some types of epitaxial reactors, a substrate to be treated is placed in a pocket of the susceptor inside a reaction chamber before the treatment by a manipulation tool, then is subjected to a treatment process, and finally is removed from the pocket of the susceptor after the treatment using the same manipulation tool. Such a susceptor may be provided with multiple pockets and therefore it is necessary to manipulate multiple substrates for each treatment process.

In some types of epitaxial reactors, the position of the susceptor, and thus of its pockets as well as the substrates that are located inside the pockets, cannot be determined with high accuracy (e.g. a precision of less than one millimeter), and therefore the manipulation tool and the control system of the tool must take this problem into account. In particular, in many cases the angular position of the plane of the pockets where the substrates are resting cannot be determined with high accuracy (e.g. a precision of less than one degree).

Some types of epitaxial reactors employ a vacuum manipulation tool in which an annular element is placed in contact with the edge of the substrate to be manipulated (typically, the upper region of the edge) and a vacuum is created between the annular element and the substrate; the better the contact between the edge and the element along the perimeter of the substrate, the more effective the grip; ideally, a vacuum sufficient to overcome only the weight of the substrate is required. The contact between the edge and the element must occur in a delicate and even manner to prevent damage to the substrate edge which, as a result, may spread inside of the upper surface of the substrate; this is true both for the substrates before the treatment process and for the substrates after the treatment process; among other things, it is worth mentioning that the treatment process may lead to small irregularities right on the edge of the substrate (so-called "edge crown"); finally, it is worth mentioning that the annular element is often made of very rigid material, typically quartz. A problem of the contact with the manipulation tool is the possible generation of particles of material (due to the crumbling of the substrate and/or the deposited layer) both before the treatment process and after the treatment process; these particles can disperse into the reactor chamber and/or end up on the substrate surface and/or end up on the surface of the deposited layer and/or remain on the tool.

A solution to the problem of manipulating substrates in reaction chambers of epitaxial reactors is described in document WO00/48234.

The Applicant has set itself the object of finding an alternative and simpler solution than the known ones.

SUMMARY

Such an object is achieved by the tool having the technical features set out in the appended claims which should be considered an integral part of the present description.

From the structural point of view, the subject matter disclosed herein uses a ball joint to provide two degrees of freedom of rotational movement to a gripping disc of a substrate to be manipulated.

In this way, a compensation of (any) non-parallelism between gripping disc and substrate is obtained.

From the structural point of view, an additional idea according to the subject matter disclosed herein is to use a gripping disc of a substrate to be manipulated with an annular element of elastic material adapted to come into contact with the edge of the substrate.

In this way, a compensation of (possible) non-parallelism and/or (possible) non-conformities between gripping disc and substrate is obtained.

By "non-conformity" it is meant that the gripping disc surface may not exactly match the substrate surface in the contact area, for example, due to spurious material in the contact area.

Preferably, the contact will be "controlled and delicate". By "controlled and delicate" it is meant that:
- during (possible) "compensation" or (possible) "compensations", the vertical force exerted by the tool on the various points of the substrate (in particular, on the points of its edge) is little but not even,
- after (possible) "compensation" or (possible) "compensations" (or if there is substantially no compensation), the vertical force exerted by the tool on the various points of the substrate (in particular, on the points of its edge) is even more little and substantially even;

this is achieved, inter alia, by ensuring that the weight of the tool head (which essentially consists of the gripping disc and the ball joint) does not substantially weigh on the substrate.

From the methodological point of view, an idea of the subject matter disclosed herein is to implement a compensation of (possible) non-parallelism between gripping disc and substrate, in particular and advantageously by means of a "controlled and delicate" contact.

Preferably, the subject matter disclosed herein provides, from the methodological point of view, for implementing a compensation of (possible) non-parallelism and of (possible) non-conformities between gripping disc and substrate.

LIST OF FIGURES

The present invention will become more apparent from the following detailed description to be considered together with the accompanying drawings, in which:

FIG. 2 shows a sectional view of the tool in FIG. 1,

FIG. 3 shows a top view of the tool in FIG. 1,

Figure 1:
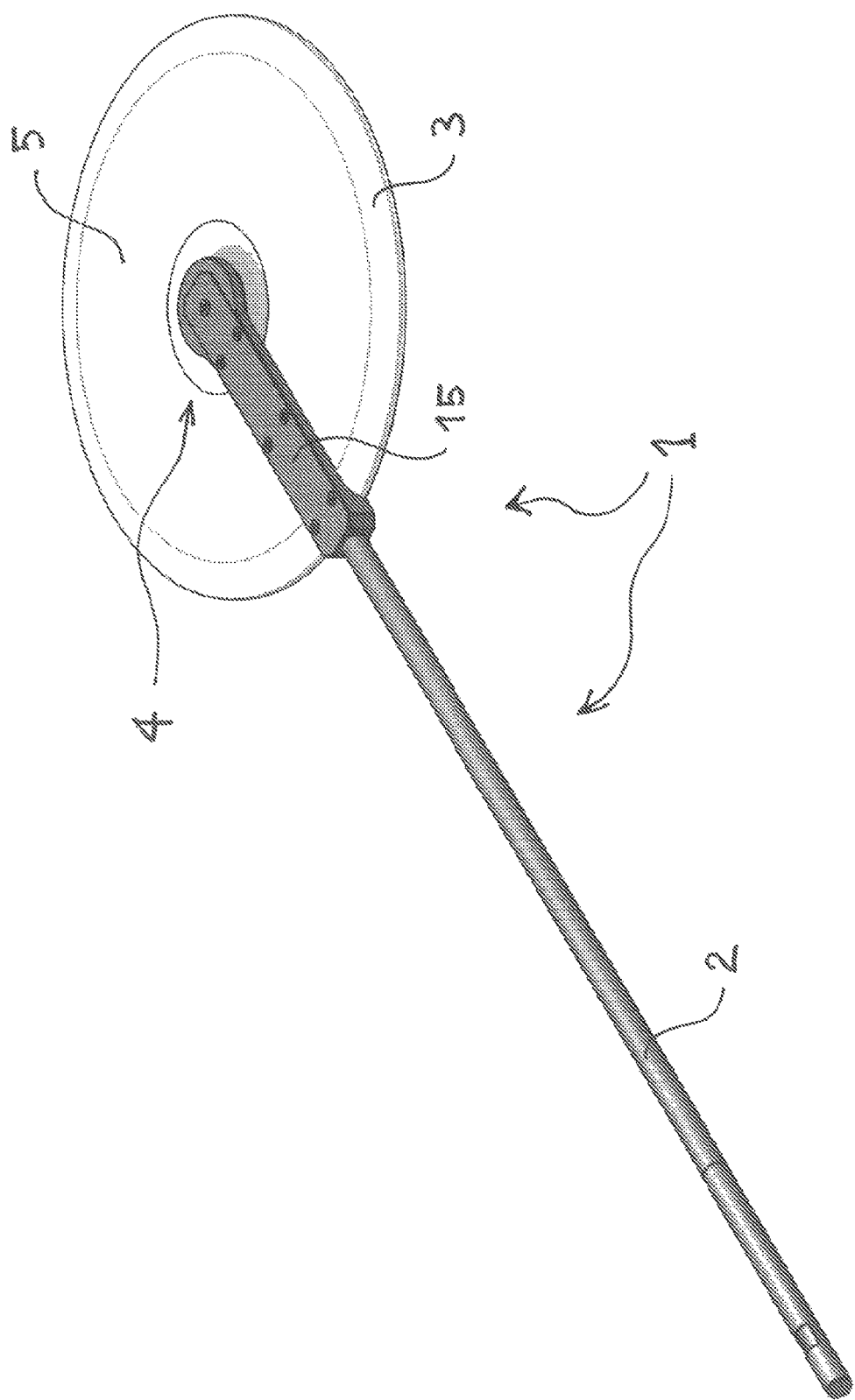
FIG. 1 shows a three dimensional view of an exemplary embodiment of a tool.

Both this description and the drawings are to be considered only for illustrative purposes and therefore non-limiting.

As it can be easily understood, there are various ways to implement in practice the present invention which is defined in its main advantageous aspects in the appended claims.

DETAILED DESCRIPTION

All the figures relate to the same exemplary embodiment of a tool 1 for manipulating substrates in an epitaxial reactor.

Tool 1 comprises an arm 2, a gripping disc 3 and a ball joint 4; the gripping disc 3 has a seat 5 on a lower side thereof for receiving a substrate 6 to be manipulated; the gripping disc 3 is mounted to arm 2 via the ball joint 4 placed centrally with respect to the gripping disc 3.

Seat 5 of the gripping disc 3 is shaped so as to come into contact only with the upper edge of substrate 6 to be manipulated. As seen in FIG. 2, in an advantageous example embodiment, seat 5 substantially corresponds to the whole lower side of the gripping disc 3 and to the whole upper side of substrate 6 to be manipulated. As seen in FIG. 2, in an advantageous example embodiment, seat 5 comprises a central cylindrical or prismatical space having a thickness for example of 5-15 mm (which constitutes a "suction cavity" and which serves to produce even suction force, without contact, on the whole upper side of the substrate to manipulate). As seen in FIG. 2, in an advantageous example embodiment, seat 5 comprises an annular truncated-conical or truncated-pyramidal space having a maximum thickness for example of 0.5-1.5 mm (which serves to contact the upper edge of the substrate to be manipulated). As seen in FIG. 2, in an advantageous example embodiment, seat 5 is fully closed when the substrate is manipulated by the tool (i.e. after the so-called "capture").

Figure 4:
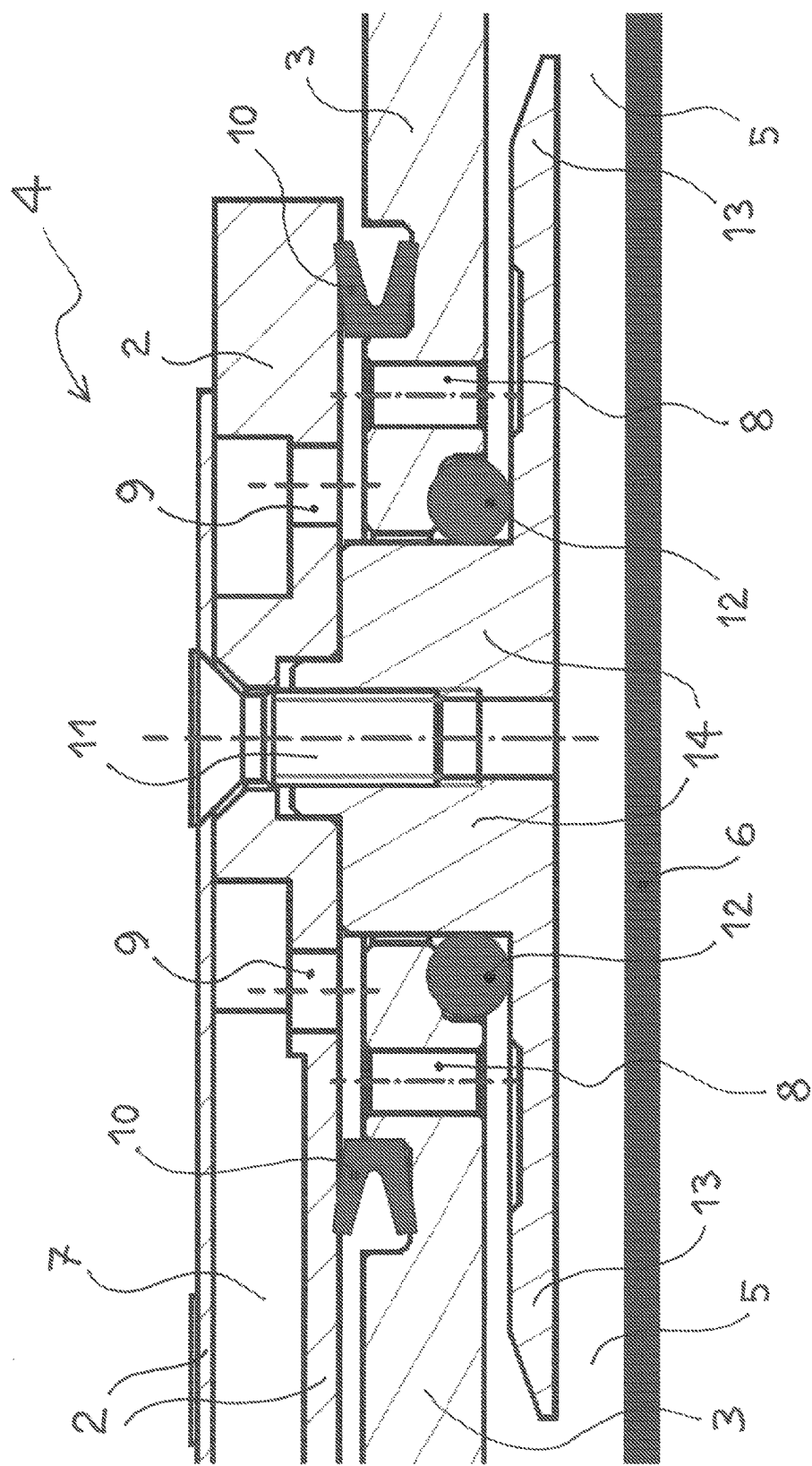
FIG. 4 shows a partial and greatly enlarged view of the section in FIG. 2.

In first approximation it may be assumed that arm 2, which is substantially an elongated cylindrical element, during use of tool 1, has its axis arranged horizontally, as seen in FIG. 2 and FIG. 3; FIG. 4 shows an axis of the ball joint 4 which, therefore, is arranged vertically.

Thanks to the ball joint 4, the gripping disc 3 is provided with at least two degrees of freedom of rotational movement with respect to arm 1; in this preferred embodiment, the gripping disc 3 is provided with only two degrees of freedom of rotational movement with respect to arm 1 (in particular, disc 3 cannot rotate about its symmetry axis which is vertical in the figures). In this way, tool 1 is able to adapt to the position of a substrate (indicated with reference numeral 6 in FIG. 2 and FIG. 4) especially when positioned in a pocket of a susceptor of an epitaxial reactor; in fact, the rotation of disc 3 leads to obtain co-planarity between the disc and the substrate (and also susceptor); it is a "natural" rotation that is not obtained by means of an actuator, but is induced by the lowering of tool 1.

Considering the figures, it is understood that the freedom of rotation of disc 3 is limited; for example, it may be +/−1° or +/−2° or +/−3° or +/−4° or +/−5° according to two axes (horizontal) orthogonal to each other.

Arm 2 internally has a suction conduit 7 and conduit 7 is in communication with seat 5; so, tool 1 is adapted to retain a substrate (indicated with reference numeral 6 in FIG. 2 and FIG. 4) when in contact with disc 3 (and of course when the suction is active).

A head 15 coupled to the ball joint 4 is located at one end of arm 2; while arm 2 is a rod with for example circular cross-section (it may be polygonal or oval or . . . ), head 15 is thin and large to allow rotation of disc 3 without the need of considerably increasing the vertical dimensions of tool 1 (see in particular FIG. 2); of course, conduit 7 also extends to the end of head 15.

Disc 3 has a plurality of holes 8 adapted to put conduit 7 into communication with seat 5 (in particular, there are eight holes).

Also arm 2 (precisely, head 15) has a plurality of holes 9 adapted to put conduit 7 into communication with seat 5 (in particular, there are eight holes).

Therefore, in the suction step, a small amount of gas that is located in seat 5 first passes through holes 8, then passes through holes 9, and finally ends up in conduit 7 (the actual final destination is a suction system in communication with conduit 7 and not shown in the figures).

A first important aspect of the ball joint 4 is how movements of rotation are possible.

A second important aspect of the ball joint 4 is how the fluid path between seat 5 and conduit 7 is sealed or substantially sealed.

In the embodiment of the figures, both these aspects are present.

The ball joint 4 comprises a first elastic element 10 (in particular, a lip seal—alternatively an annular elastic bellows or an O-ring) placed between arm 2 (precisely, head 15) and the gripping disc 3; the elastic element 10 is also adapted to provide sealing.

The ball joint 4 comprises an articulation body (set of elements 13 and 14 in FIG. 4) and a second annular elastic element 12 (in particular, an O-ring) placed between the articulation body and the gripping disc 3; the elastic element 12 is adapted to also provide sealing as well.

In general, the elastic elements comprised in the spherical joint are typically one or two or three and can be variously arranged therein, depending on the specific realization of the joint. Such elastic elements are used, among other things, for stabilizing the position of the tool gripping disc (possibly also of the substrate transported) during the movement of the tool.

The elastic elements 10 and 12 may be made of elastomeric or metal material; a material that is well suited for application in an epitaxial reactor is for example VITON, a synthetic rubber produced by Dupont company.

In the example embodiment in FIG. 4, the articulation body comprises an articulation disc 13 (in particular, circular) and a joint stem 14 (in particular, cylindrical), for example made in a single piece. Stem 14 has a hole and head 15 has a hole; a screw 11 is screwed in both of these two holes and serves to fix arm 2 (namely, head 15) and the articulation body to each other; the annular elastic element 12 is placed between the articulation disc 13, the joint stem 14 and the gripping disc 3.

In the example embodiment in the figures, elements 2, 13, 14 and 15 are of steel and element 9 is of quartz (a material particularly adapted to come into direct contact with the substrates outside and inside a reaction chamber).

The possibility of rotation of the gripping disc 3 is given by the ball joint 4 and is allowed by the elasticity of the elastic element or the elastic elements present in the ball joint 4.

Typically, the gripping disc rotates simply by contact between the disc and the edge, i.e. there is no actuator to rotate the disc.

The delicacy of contact between tool 1 and substrate (indicated with reference numeral 6 in FIG. 2 and FIG. 4) is favored by the softness of the material or materials of the elastic element or elastic elements present in the ball joint 4.

Preferably, the weight of the tool rests (entirely) on a movement system of the tool itself, i.e. neither on the substrate nor on the susceptor; in this way, when the gripping disc comes into contact with the edge of the substrate, just a very small force will be sufficient to cause a rotation of the gripping disc; considering the example embodiment in the figures, such a force will only have to overcome the reaction of the elastic elements in the ball joint.

Advantageously, in order to make the weight of the tool not weigh on substrate and susceptor, it can be envisaged to divide the arm (indicated with reference numeral 2 in the figures) of the tool into two half arms, connect the two half arms by a hinge and associating a spring to the hinge to contrast the downwards rotation of the hinge.

According to embodiments of the present invention, the manipulation consists in carrying a substrate close to a susceptor and placing the substrate on the susceptor (in particular, in a seat thereof, also called "pocket") and then, taking the substrate (with a deposited layer) from the susceptor (in particular from a seat thereof, also called "pocket") and carrying the substrate away from the susceptor; a tool with a gripping disc is used for manipulation. The manipulation method comprises the steps of:

A) horizontally moving said tool until said gripping disc is at said seat,
B) lowering said tool until said gripping disc touches at least one point of the upper edge of said substrate (see FIG. 6),
C) continuing lowering said tool until said gripping disc touches all the upper edge of said substrate via a rotation movement (specifically a tilting movement) with respect to a horizontal axis (consider any horizontal axis that is perpendicular to the vertical symmetry axis highlighted in FIG. 4 and which lies at least partly in the gripping disc 3 at a level between the elastic elements 10 and 12) but via no rotation movement (i.e. being rotatably fixed) with respect to a vertical symmetry axis of said gripping disc,
D) sucking said substrate by means of a suction system of said tool,
E) raising said tool with said substrate (retained by sucking), and
F) horizontally moving said tool with said substrate (retained by sucking).

Step A is an approach step and typically provides an only-horizontal movement.

Steps B and C together carry out an auto-leveling between gripping disc and substrate.

Step D can be defined a "capture" step. If the tool is provided with a "suction cavity" (such as the tool in FIG. 2 and FIG. 3), in step D an even suction force is produced, without contact, on the whole upper side of the substrate to be manipulated.

Step F is a removal step and typically provides an only-horizontal movement.

In step C, the gripping disc touches the upper edge of the substrate; with good approximation, it is a contact along the whole edge.

Typically, the gripping disc rotates simply by contact between the disc and the edge, i.e. there is no actuator to rotate the disc.

Preferably, at least during steps A, B, C, E and F, the weight of the tool rests (entirely) on a movement system of the tool itself, i.e. neither on the substrate nor on the susceptor; in this way, when the gripping disc comes into contact with the edge of the substrate, just a very small force will be sufficient to cause a rotation of the gripping disc; considering the example embodiment in the figures, such a force will only have to overcome the reaction of the elastic elements of the ball joint.

Figure 5:
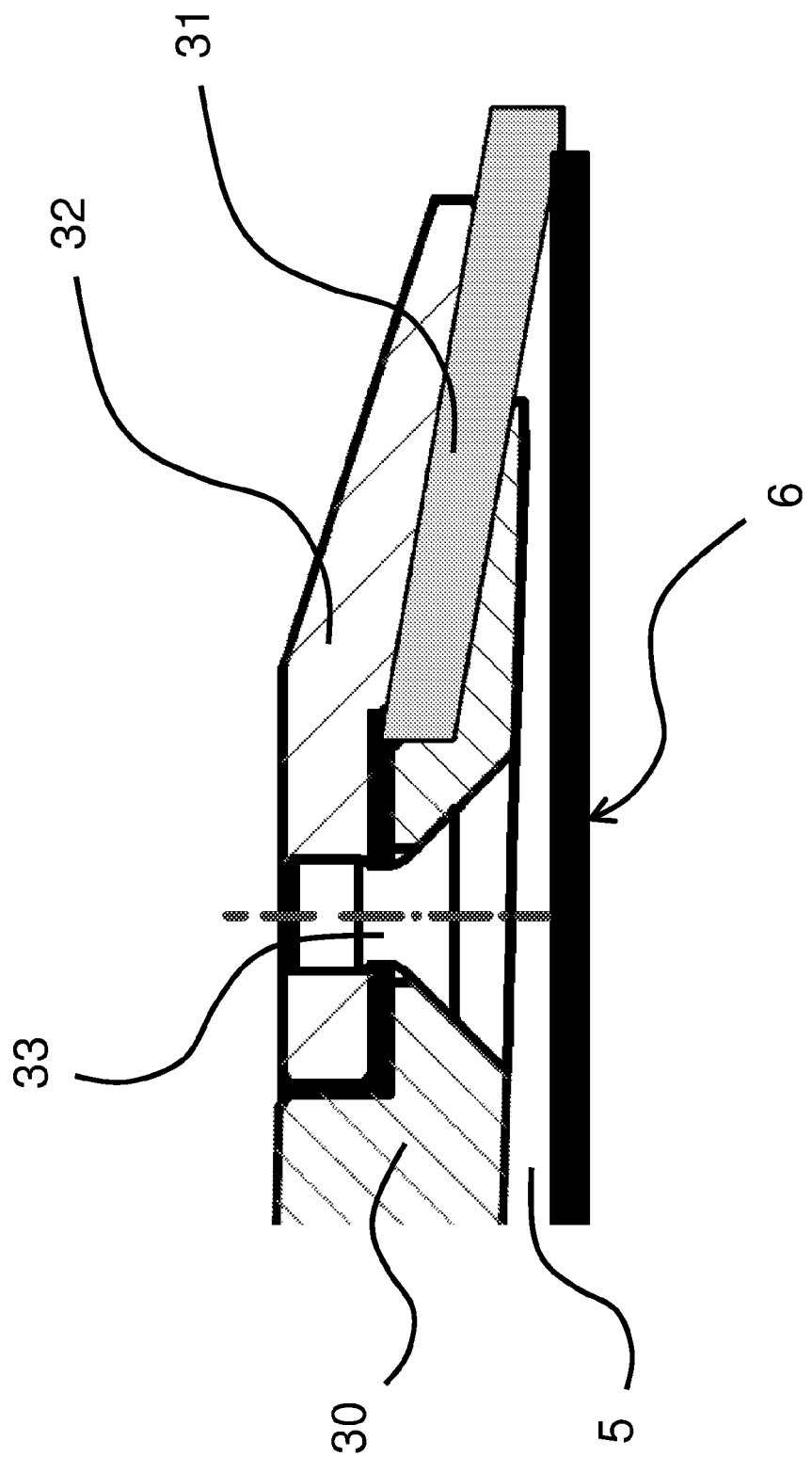
FIG. 5 shows a partial and greatly enlarged view of a section of an exemplary embodiment of a tool similar to that in FIG. 2, but which also has an annular element of elastic material.

Unlike the example embodiment in FIG. 2 and FIG. 3 and as (partially) shown in FIG. 5, the gripping disc (substantially corresponding to body 30) also comprises an annular element 31 of elastic material adapted to come into contact only with the upper edge of substrate 6 to be manipulated—such an annular ring (and the relative installation means) is the only substantial difference with the example in FIG. 2 and FIG. 3.

The annular element can be made in a single piece or a plurality of near pieces.

The elastic material may be a polymeric material, in particular adapted to withstand continuous operation at temperatures above 200° C., for example between 250° C. and 350° C.; in particular, fluorinated or perfluorinated polymers with elastomeric properties may advantageously be used; a particularly suitable material is "Kalrez® 4079" produced by the company Dupont KALREZ 4079 is an elastomer with a Shore A hardness of 75).

Alternatively, for example, other elastomeric materials capable of withstanding high temperatures, chemical attack (in particular from acids) and quite soft (e.g. Shore A hardness between 50 and 80) may be used.

The resistance of the material of the annular element allows manipulating relatively ho substrates; for example, in the case of KALREZ 4079, substrates may be manipulated at 300° C. (and even beyond). This allows reducing the process cycle time of the epitaxial reactor because the substrates treated may be discharged from the reactor (i.e. extracted from its reaction chamber) when they are still quite hot (i.e. without letting them cool down completely) and without damaging them thanks to the "controlled and delicate" contact only on their edge.

The annular element 31 can be tightened (for example by means of screws 33) between a body 30 of the gripping disc (for example arranged below) and a clamping ring 32 (for example arranged above); this is the example embodiment in FIG. 5.

The annular element 31 may (substantially) be shaped as a circular crown; the annular element 31 may be (substantially) flat; this is the example embodiment in FIG. 5.

Body 30 of the gripping disc and/or the clamping ring 32 can be made of quartz or silicon carbide or titanium or stainless steel or a coated aluminum alloy (preferably coated with thermoplastic material), or FRP (in particular, CFRP). In particular, for body 30 to be particularly light, it may be made of an aluminum alloy (such as alloy 7075, commercially known as "Ergal") coated with thermoplastic material (such as PEEK=polyetheretherketone).

In the example embodiment in FIG. 5, as a result of the contact between annular element of the gripping disc and edge of the substrate, the annular element deforms elastically; in particular, such a deformation at any point is small (typically less than 1 or 2 mm) and thus the vertical force exerted by the tool on any point of the substrate (in particular of its edge) is small.

The delicacy of the contact between tool (in particular the annular element 31 of tool 1 in FIG. 5) and substrate (in particular substrate 6 in FIG. 5) is favored by the softness of the material of the annular element of the tool.

Preferably, also in the example embodiment in FIG. 5, the weight of the tool weighs (entirely) on a movement system of the tool itself, i.e. neither on the substrate nor on the susceptor; when the annular element of the gripping disc comes into contact with the substrate edge, just a small force is sufficient to cause the deformation of the annular element while the tool is lowered further.

Later, while the tool rises, the annular element returns to its natural shape thanks to the elasticity of its material.

The tool in FIG. 5 is used similarly to that in FIG. 2 and FIG. 3 and FIG. 4, but in step C, the annular element may deform slightly and elastically.

The solution shown partially in FIG. 5 provides for the gripping disc to be mounted to the arm using a ball joint (see for example FIG. 4).

In the example embodiments described, one or more or all components 2, 3, 13 (if present), 14 (if present), 15 (if present), 30 and 32 (if present) can be made of quartz or silicon carbide or titanium or stainless steel or a coated aluminum alloy (preferably coated with thermoplastic material), or FRP (in particular, CFRP).

Figure 6:
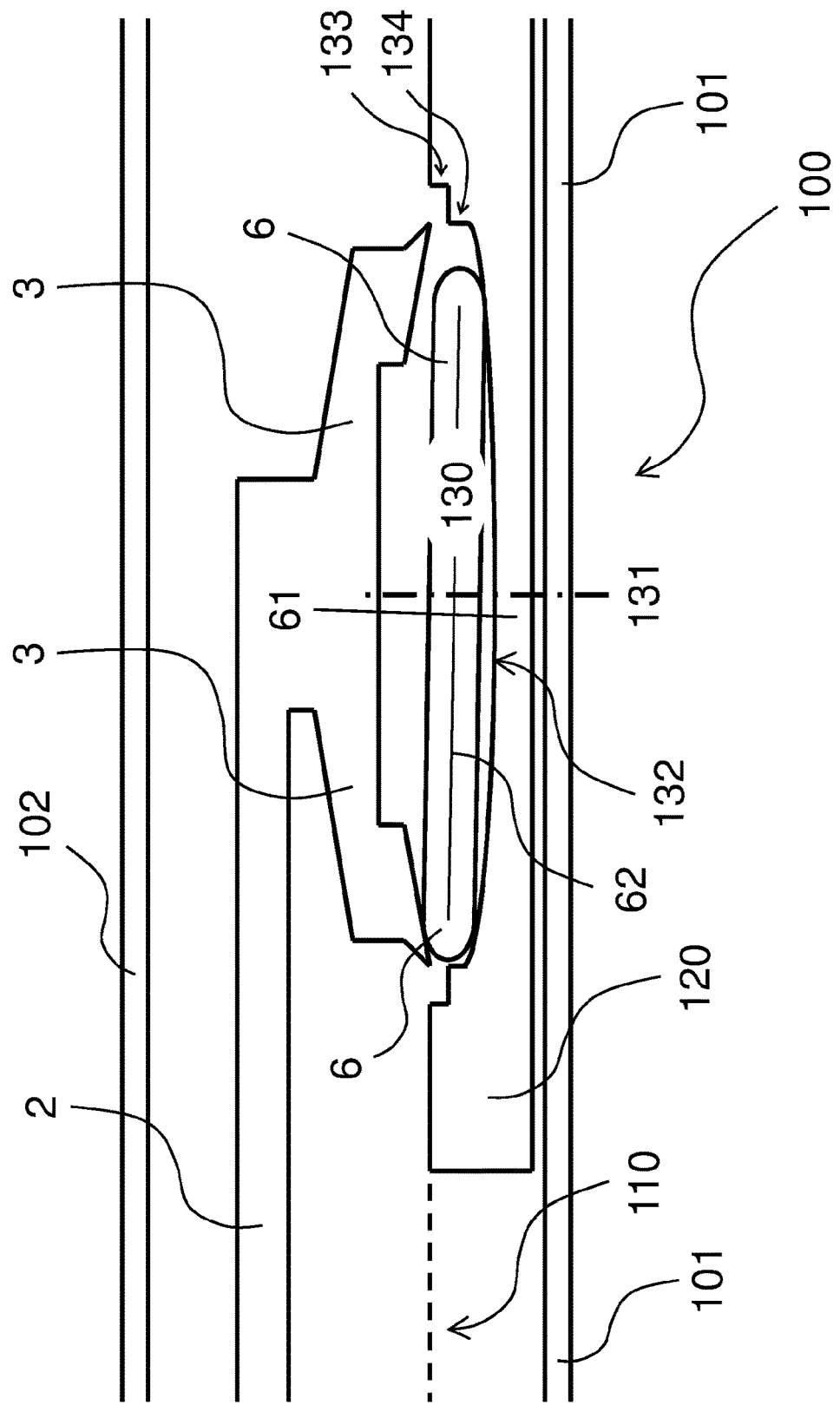
FIG. 6 shows a schematic sectional and out of scale view of a tool within a reaction chamber of an epitaxial reactor while it manipulates a substrate.

As already said, the tool according to embodiments of the present invention finds particularly advantageous application in epitaxial reactors, particularly those in which the reaction chamber (usually placed horizontally) has a cavity of reduced height, in particular a few centimeters, for example in the range of 2-5 cm, (usually, the height of this kind of cavities is substantially the same in the various parts of the chamber); such an application is shown for example in FIG. 6.

According to embodiments of the present invention, the manipulation consists in transporting a substrate (6 in FIG. 6) near a susceptor (120 in FIG. 6) and placing the substrate on the susceptor, in particular in a seat thereof generally called "pocket" (130 in FIG. 6), and then taking the substrate (with a deposited layer) from the susceptor, in particular from the "pocket", and carrying the substrate away from the susceptor.

In FIG. 6, the reaction chamber of an epitaxial reactor is globally indicated with reference numeral 100, and the lower wall 101 of quartz and the upper wall 102 of quartz are visible. Inside the chamber there is a rotating susceptor 120 shaped as a horizontal disc (typically a solid body made of graphite); susceptor 120 has a plurality of horizontal pockets 130 adapted to accommodate substrates 6. Typically, susceptor 120 is surrounded by "coating devices" of the chamber which are shown schematically with reference numeral 110 in FIG. 6.

Pocket 130 has a vertical symmetry axis 131, has a slightly concave bottom 132 (the center is deeper, for example by 1-5 mm, than the outline), and consists of a first higher cylindrical volume 133 (with a thickness of for example, 1-3 mm) and a second lower cylindrical volume 134 (with a thickness of for example, 1-3 mm); the radius of volume 134 is less than the radius of volume 133, for example by 1-5 mm.

A substrate 6 is accommodated within pocket 130; however, its position cannot be known with absolute certainty; the position of substrate 6 can be defined by its symmetry axis 61 and its median plane 62. In the case of FIG. 6, the center of substrate 6 is moved laterally with respect to the center of pocket 130 but, due to the concave bottom 132 on which it rests, axis 61 of substrate 6 is inclined with respect to axis 131 of pocket 130.

FIG. 6 schematically shows also a tool according to embodiments of the present invention comprising an arm 2 and a gripping disc 3; the tool is inserted into the reaction chamber so that the gripping disc 3 is aligned with pocket 130; but it is not aligned with substrate 6.

The situation in FIG. 6 corresponds to when the tool is lowered until the gripping disc 3 touches in a point the upper edge of substrate 6, i.e. at the end of step B described above; the contact may occur with body 30 (as in FIG. 2) or with the annular element 31 (as in FIG. 5).

Continuing to lower the tool, the gripping disc 3 tilts (by an angle corresponding to the angle formed by axes 61 and 131) and touches all the upper edge of substrate 6; the contact between the tool and the substrate is better, i.e. is along a closed line, if there is also an annular element of elastic material (for example, element 31 in FIG. 5) at the lower edge of the gripping disc.

The invention claimed is:

1. A tool for manipulating substrates in an epitaxial reactor, comprising an arm, a gripping disc and a ball joint;
    wherein said gripping disc has a seat on an underside thereof configured for retaining a substrate to be manipulated;
    wherein said gripping disc is mounted to the arm through said ball joint placed centrally with respect to said gripping disc;
    wherein said gripping disc is shaped so as to come into contact only with an upper edge of said substrate to be manipulated;
    wherein said gripping disc has two degrees of freedom of rotational movement with respect to said arm to allow it to adapt to a position of a substrate in a pocket of a susceptor of an epitaxial reactor.

2. The tool of claim 1, wherein said seat comprises a space which forms a suction cavity and which serves to produce a substantially even suction force over an upper side of said substrate to be manipulated.

3. The tool of claim 2, wherein said arm has a plurality of holes adapted to put said suction conduit in communication with said seat.

4. The tool of claim 1, wherein said arm internally has a suction conduit;
    wherein said suction conduit is in communication with said seat; whereby the tool is adapted to retain a substrate when in contact with said gripping disc.

5. The tool of claim 4, wherein said gripping disc has a plurality of holes adapted to put-said suction conduit in communication with said seat.

6. The tool of claim 1, wherein said ball joint comprises at least one annular spring element placed between said arm and said gripping disc.

7. The tool of claim 6, wherein said arm internally has a suction conduit;
    wherein said suction conduit is in communication with said seat; whereby the tool is adapted to retain a substrate when in contact with said gripping disc, and wherein said spring element is adapted to also provide sealing.

8. The tool of claim 1, wherein said ball joint comprises an articulation body and a further annular spring element placed between said articulation body and said gripping disc.

9. The tool of claim 8, wherein said arm internally has a suction conduit;
    wherein said suction conduit is in communication with said seat; whereby the tool is adapted to retain a substrate when in contact with said gripping disc, and wherein said further spring element is adapted to also provide sealing.

10. The tool of claim 8, wherein said articulation body comprises an articulation disc and a joint stem; wherein said further annular spring element is placed between said joint stem and said gripping disc.

11. The tool of claim 1, wherein said gripping disc comprises an annular element of elastic material adapted to contact the edge of a substrate to be manipulated.

12. The tool of claim 11, wherein said elastic material is a polymer material, in particular adapted to withstand temperatures above 200° C., in particular between 250° C. and 350° C., in continuous service.

13. The tool of claim 11, wherein said annular element is tightened between a body of said gripping disc and a clamping ring of said gripping disc.

14. The tool of claim 13, wherein said body of said gripping disc and/or said clamping ring of said gripping disc are made of quartz or silicon carbide or titanium or stainless steel or a coated aluminum alloy or FRP.

15. The tool of claim 11, wherein said annular element (31) is in the shape of a circular crown and is flat.

16. An epitaxial reactor comprising at least one tool according to claim 1.

17. A tool for manipulating substrates in an epitaxial reactor, comprising an arm, a gripping disc and a ball joint;
wherein said gripping disc has a seat on an underside thereof configured for retaining a substrate to be manipulated;
wherein said gripping disc is mounted to the arm through said ball joint placed centrally with respect to said gripping disc;
wherein said gripping disc is shaped so as to come into contact only with an upper edge of said substrate to be manipulated;
wherein said gripping disc has two degrees of freedom of rotational movement with respect to said arm to allow it to adapt to a position of a substrate in a pocket of a susceptor of an epitaxial reactor.

* * * * *